(12) United States Patent
Yoon et al.

(10) Patent No.: US 9,287,120 B2
(45) Date of Patent: Mar. 15, 2016

(54) METHOD FOR DISPERSING QUANTUM DOTS OR QUANTUM WIRES IN ZEOLITE, METHOD FOR STABILIZING QUANTUM DOTS OR QUANTUM WIRES IN ZEOLITE, AND ZEOLITE CONTAINING QUANTUM DOTS OR QUANTUM WIRES DISPERSED BY THE METHOD

(75) Inventors: Kyung Byung Yoon, Seoul (KR); Hyun Sung Kim, Seoul (KR); Nak Cheon Jeong, Daegu (KR)

(73) Assignee: Sogang University Research Foundation, Seoul (KR)

( * ) Notice: Subject to any disclaimer, the term of this patent is extended or adjusted under 35 U.S.C. 154(b) by 283 days.

(21) Appl. No.: 13/979,965

(22) PCT Filed: Jan. 19, 2012

(86) PCT No.: PCT/KR2012/000476
§ 371 (c)(1),
(2), (4) Date: Sep. 24, 2013

(87) PCT Pub. No.: WO2012/099410
PCT Pub. Date: Jul. 26, 2012

(65) Prior Publication Data
US 2014/0008605 A1    Jan. 9, 2014

(30) Foreign Application Priority Data

Jan. 19, 2011 (KR) .................... 10-2011-0005386
Sep. 29, 2011 (KR) .................... 10-2011-0099174

(51) Int. Cl.
*H01L 21/02* (2006.01)
*H01L 29/66* (2006.01)
(Continued)

(52) U.S. Cl.
CPC ......... *H01L 21/02601* (2013.01); *B01J 29/061* (2013.01); *B01J 29/076* (2013.01); *B01J 29/087* (2013.01); *B01J 29/088* (2013.01); *B01J 29/163* (2013.01); *B01J 29/166* (2013.01);
(Continued)

(58) Field of Classification Search
CPC . H01L 21/02601; B01J 29/061; B01J 29/076; B01J 29/087; B01J 29/088; B01J 29/163; B01J 29/166; B01J 29/185; B01J 29/26; B01J 29/605; B01J 29/64; B01J 29/84
See application file for complete search history.

(56) References Cited

U.S. PATENT DOCUMENTS 6,107,243 A * 8/2000 Inagaki et al. ................ 502/407
2006/0245994 A1 * 11/2006 Watanabe et al. ............. 423/305

FOREIGN PATENT DOCUMENTS

KR    10-2002-0068102    8/2002
KR    10-2004-0059588    7/2004
(Continued)

OTHER PUBLICATIONS

Jeong et al article ,( Tight Confinement of Semiconductor Quantum Dots within Zeolite by Surface Silylation).*
(Continued)

*Primary Examiner* — Mamadou Diallo
(74) *Attorney, Agent, or Firm* — Greer Burns & Crain Ltd.

(57) ABSTRACT

The present application relates to a method for dispersing quantum dots (QDs) or quantum wires in zeolite, to zeolite containing quantum dots or quantum wires dispersed by the method, and to a method for stabilizing quantum dots or quantum wires in zeolite.

18 Claims, 14 Drawing Sheets

(51) Int. Cl.

| | | |
|---|---|---|
| *H01L 29/12* | (2006.01) | |
| *C01B 39/02* | (2006.01) | |
| *C01B 39/24* | (2006.01) | |
| *B01J 37/20* | (2006.01) | |
| *B01J 29/06* | (2006.01) | |
| *B01J 29/076* | (2006.01) | |
| *B01J 29/08* | (2006.01) | |
| *B01J 29/16* | (2006.01) | |
| *B01J 29/18* | (2006.01) | |
| *B01J 29/26* | (2006.01) | |
| *B01J 29/60* | (2006.01) | |
| *B01J 29/64* | (2006.01) | |
| *B01J 29/84* | (2006.01) | |
| *B01J 29/85* | (2006.01) | |
| *B01J 29/86* | (2006.01) | |
| *B01J 29/87* | (2006.01) | |
| *B82Y 10/00* | (2011.01) | |
| *B01J 35/00* | (2006.01) | |

(52) U.S. Cl.
CPC ............... *B01J 29/185* (2013.01); *B01J 29/26* (2013.01); *B01J 29/605* (2013.01); *B01J 29/64* (2013.01); *B01J 29/84* (2013.01); *B01J 29/85* (2013.01); *B01J 29/86* (2013.01); *B01J 29/87* (2013.01); *B01J 37/20* (2013.01); *B82Y 10/00* (2013.01); *C01B 39/026* (2013.01); *C01B 39/24* (2013.01); *H01L 21/02422* (2013.01); *H01L 21/02521* (2013.01); *H01L 21/02603* (2013.01); *H01L 21/02628* (2013.01); *H01L 29/125* (2013.01); *H01L 29/127* (2013.01); *H01L 29/66977* (2013.01); *B01J 35/0013* (2013.01); *B01J 2229/186* (2013.01); *B01J 2229/38* (2013.01)

(56) References Cited

FOREIGN PATENT DOCUMENTS

| | | |
|---|---|---|
| KR | 10-2005-0003548 | 1/2005 |
| KR | 10-2009-0112159 | 10/2009 |
| KR | 10-2010-0120011 | 11/2010 |

OTHER PUBLICATIONS

International Search Report issued in International App. No. PCT/KR2012/000476, mailed Jul. 31, 2012.

\* cited by examiner

<sup>13</sup>C NMR sod : sup = 1.00 : 0.89 = 53: 47

METHOD FOR DISPERSING QUANTUM DOTS OR QUANTUM WIRES IN ZEOLITE, METHOD FOR STABILIZING QUANTUM DOTS OR QUANTUM WIRES IN ZEOLITE, AND ZEOLITE CONTAINING QUANTUM DOTS OR QUANTUM WIRES DISPERSED BY THE METHOD

This application is a U.S. National Phase under 35 U.S.C §371 of International Application No. PCT/KR2012/000476 filed on Jan. 19, 2012, claiming priority based on Korean Patent Application No. 10-2011-0005386 filed on Jan. 19, 2011 and Korean Patent Application No. 10-2011-0099174 filed on Sep. 29, 2011, the entire disclosure of both of which are incorporated herein by reference for all purposes.

TECHNICAL FIELD

The present disclosure relates to a dispersing method of quantum dots (QDs) or quantum wires in zeolite, quantum dot- or quantum wire-containing zeolite dispersed by the dispersing method, and a stabilizing method of quantum dots or quantum wires in zeolite.

BACKGROUND ART

In the field of nanoscience, it is important to prepare monodispersed semiconductor quantum dots (QDs), arrange the semiconductor quantum dots in a two-dimensional or three-dimensional array, and stabilize species which is very unstable under an atmosphere in case of long-time application. Zeolite has a nanoporous structure in which uniform-sized and shaped nanopores are arranged regularly, and, thus, it has been used as a host for preparing very small ligand free quantum dots having a uniform diameter (of less than 1.5 nm), arranging such quantum dots in a regular array, and stabilizing them for a long time. Over the past 20 years, there has been a lot of research on production, characteristics and applications of zeolite. Korean Registered Patent No. 10-0399666 describes a method of producing zinc oxide nanosemiconductor-zeolite including ion exchanging zeolite with divalent or trivalent alkaline-earth metal, transition metal, or rare-earth metal and oxidizing the zeolite by exposing the zeolite to zinc steam. However, although most of zeolite has a hygroscopic property and absorbed water can sensitively affect properties, physicochemical characteristics and applications of quantum dots, there is no explanation of an influence of the absorbed water on characteristics and a principal structure of the quantum dots. Although such explanations are not provided, a lot of research on production, characteristics and applications of quantum dots is being carried out simply assuming that quantum dots are present in pores of zeolite in an ambient condition.

Therefore, in order to increase understanding of characteristics of quantum dots in zeolite and explain applications of quantum dots in zeolite in various conditions, research on an influence of water in zeolite on quantum dots and a method for stabilizing the quantum dots from the water is demanded.

DISCLOSURE OF THE INVENTION

Problems to be Solved by the Invention

The present inventors perfected the present invention upon finding that quantum dots in zeolite can be uniformly dispersed and stabilized depending on a kind of a counter cation of the zeolite charged with anions.

In view of the foregoing, the present disclosure provides a dispersing method of quantum dots (QDs) or quantum wires in zeolite, quantum dot- or quantum wire-containing zeolite dispersed by the dispersing method, and a stabilizing method of quantum dots or quantum wires in zeolite.

However, problems to be solved by the present disclosure are not limited to the above-described problems. Although not described herein, other problems to be solved by the present disclosure can be clearly understood by those skilled in the art from the following descriptions.

Means for Solving the Problems

In accordance with a first aspect of the present disclosure, there is provided a dispersing method of quantum dots or quantum wires in zeolite, the dispersion method including: treating zeolite containing quantum dots or quantum wires using a basic gas.

In accordance with a second aspect of the present disclosure, there is provided quantum dot- or quantum wire-containing zeolite that includes dispersed quantum dots or dispersed quantum wires, wherein the quantum dots or the quantum wires are dispersed in the zeolite by the dispersing method in accordance with the first aspect of the present disclosure.

In accordance with a third aspect of the present disclosure, there is provided a stabilizing method of quantum dots or quantum wires in zeolite, the stabilization method including: treating zeolite containing quantum dots or quantum wires with a basic gas to disperse the quantum dots or the quantum wires in the zeolite.

Effect of the Invention

According to a dispersing method and a stabilizing method of quantum dots or quantum wires in zeolite of the present disclosure, very small and ligand free quantum dots or quantum wires in zeolite do not agglomerate with adjacent quantum dots or quantum wires despite presence of absorbed water, and the very small and ligand free quantum dots or quantum wires are uniformly dispersed in a cage of the zeolite with high stability without destroying a structure of the zeolite. Thus, even if exposed to an atmosphere for a long time (for example, 4 weeks), the quantum dots or quantum wires can maintain their own characteristics. Therefore, despite presence of water, zeolite containing quantum dots or quantum wires can be used as a catalyst or the like in various fields.

BEST MODE FOR CARRYING OUT THE INVENTION

Figure 1:
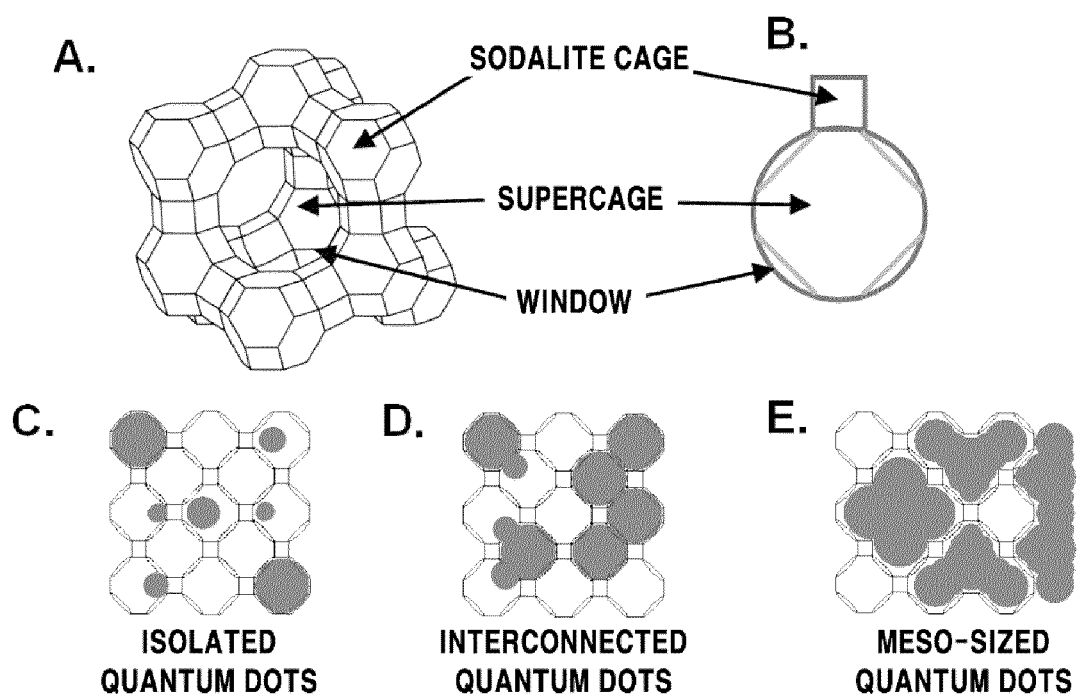
FIG. 1 shows a structure of zeolite Y and geometrical structures of three types of quantum dots present in the zeolite Y in accordance with an illustrative embodiment of the present disclosure.

Hereinafter, illustrative embodiments and examples of the present disclosure will be described in detail with reference to the accompanying drawings so that the present disclosure may be readily implemented by those skilled in the art.

However, it is to be noted that the present disclosure is not limited to the illustrative embodiments and examples but can be embodied in various other ways. In drawings, parts irrelevant to the description are omitted for the simplicity of explanation, and like reference numerals denote like parts through the present disclosure.

Through the present disclosure, the term "on" that is used to designate a position of one element with respect to another element includes both a case that the one element is adjacent to the another element and a case that any other element exists between these two elements.

Further, the term "comprises or includes" and/or "comprising or including" used in the document means that one or more other components, steps, operation and/or existence or addition of elements are not excluded in addition to the described components, steps, operation and/or elements unless context dictates otherwise. The term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the present disclosure, the term "step of" does not mean "step for".

Through the present disclosure, the term "combinations thereof" included in Markush type description means mixture or combinations thereof one or more components, steps, operations and/or elements selected from a group consisting of components, steps, operation and/or elements described in Markush type and thereby means that the disclosure includes one or more components, steps, operations and/or elements selected from the Markush group.

Through the present disclosure, the term "quantum dot" means a part of a material (for example, a semiconductor) whose excitons is confined in all three spatial dimensions and is a nanometer-sized zero-dimensional particle having distinctive optical and electronic properties. By way of example, it may include a nanometer-sized semiconductor crystal.

Through the present disclosure, the term "quantum wire" means an electrically conducting wire in which quantum effects influence transport properties and is a one-dimensional nanowire limited to be nano-sized in two directions of three spatial dimensions.

In accordance with the first aspect of the present disclosure, there is provided a dispersing method of quantum dots or quantum wires in zeolite, including treating zeolite containing quantum dots or quantum wires with a basic gas.

In accordance with an illustrative embodiment, the quantum dots or the quantum wires may be uniformly dispersed in pores of the zeolite, but the present disclosure may not be limited thereto.

In accordance with another illustrative embodiment, the quantum dots or the quantum wires may include, but may not be limited thereto, a metal, an oxide, or a compound semiconductor.

In an illustrative embodiment, the compound semiconductor may include, but may not be limited thereto, a sulfide and an oxide containing one or more metals, or a compound containing one or more metals and one or more non-metals. By way of example, the compound semiconductor may include a member selected from, but may not be limited thereto, the group consisting of CdS, CdO, CdSe, CdTe, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTE, HgO, HgS, HgSe, HgTe, Al$_2$O$_3$, Al$_2$S$_3$, Al$_2$Se$_3$, Al$_2$Te$_3$, Ga$_2$O$_3$, Ga$_2$S$_3$, Ga$_2$Se$_3$, Ga$_2$Te$_3$, In$_2$O$_3$, In$_2$S$_3$, In$_2$Se$_3$, In$_2$Te$_3$, SiO$_2$, GeO$_2$, SnO$_2$, SnS, SnSe, SnTe, PbO, PbO$_2$, PbS, PbSe, PbTe, AlN, Alp, AlAs, AlSb, GaN, GaP, GaAs, GaSb, InN, InP, InAs, InSb, BP, Si, Ge, and combinations thereof.

In accordance with still another illustrative embodiment, the basic gas may include, but may not be limited thereto, NH$_3$, PH$_3$, AsH$_3$, amine gases, or combinations thereof.

In accordance with still another illustrative embodiment, the quantum dots or the quantum wires in the pores of the zeolite may be dispersed in isolated state from each other, but the present disclosure may not be limited thereto.

In accordance with still another illustrative embodiment, the quantum dots or the quantum wires may be stably dispersed in the zeolite under an atmosphere, but the present disclosure may not be limited thereto.

Through the present disclosure, the zeolite is a microporous crystalline molecular structure composed of lattice silica and/or optionally alumina bound to an exchangeable cation (for example, alkaline metal ion or alkaline earth metal ion). The term "zeolite" includes a material containing silica and optionally alumina, but a part of the silica and a part of the alumina may be substituted by different oxides as a whole or in part. For example, a part of the silica can be substituted by a germanium oxide, a titanium oxide, a tin oxide, a phosphorous oxide, and combinations thereof. A part of the alumina can be substituted by a boron oxide, an iron oxide, a gallium oxide, an indium oxide, and combinations thereof. Therefore, through the present disclosure, the terms "zeolite", "zeolites", and "zeolite material" mean a material containing a silicon atom and optionally an aluminum atom within its crystal lattice structure and also means a material containing an appropriate substituent for silicon and aluminum, such as zeolite Y, zeolite X, zeolite A, zeolite L, mordenite, gallosilicate, borosilicate, silicoaluminophosphate (SAPO), and aluminophosphate (ALPO). The term "aluminosilicate zeolite" means, but may not be limited thereto, a zeolite material requisitely containing a silicon atom and an aluminum atom in its crystal lattice structure.

In accordance with an illustrative embodiment, the zeolite may include, but may not be limited thereto, zeolite Y, zeolite X, zeolite A, zeolite L, mordenite, gallosilicate, borosilicate, silicoaluminophosphate (SAPO), or aluminophosphate (ALPO).

In accordance with the second aspect of the present disclosure, there is provided zeolite that includes dispersed quantum dots or dispersed quantum wires, wherein the quantum dots or the quantum wires are dispersed in the zeolite by the dispersing method of quantum dots or quantum wires in zeolite in accordance with the first aspect of the present disclosure.

In accordance with an illustrative embodiment, the quantum dots or the quantum wires may be uniformly dispersed in pores of the zeolite, but the present disclosure may not be limited thereto.

In accordance with another illustrative embodiment, the quantum dots or the quantum wires may include, but may not be limited thereto, a metal, an oxide, or a compound semiconductor.

In an illustrative embodiment, the compound semiconductor may include, but may not be limited thereto, a sulfide and an oxide containing one or more metals, or a compound containing one or more metals and one or more non-metals. By way of example, the compound semiconductor may include a member selected from, but may not be limited thereto, the group consisting of CdS, CdO, CdSe, CdTe, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTE, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, Alp, AlAs, AlSb, GaN, GaP, GaAs, GaSb, InN, InP, InAs, InSb, BP, Si, Ge, and combinations thereof.

In accordance with still another illustrative embodiment, the quantum dots or the quantum wires in the pores of the zeolite may be dispersed in isolated state from each other, but the present disclosure may not be limited thereto.

In accordance with still another illustrative embodiment, the quantum dots or the quantum wires may be stably dispersed in the zeolite under an atmosphere, but the present disclosure may not be limited thereto.

In accordance with an illustrative embodiment, the zeolite may include, but may not be limited thereto, zeolite Y, zeolite X, zeolite A, zeolite L, mordenite, gallosilicate, borosilicate, silicoaluminophosphate (SAPO), or aluminophosphate (ALPO).

In accordance with the third aspect of the present disclosure, there is provided a stabilizing method of quantum dots or quantum wires in zeolite, the stabilization method including: treating zeolite containing quantum dots or quantum wires with a basic gas to disperse the quantum dots or the quantum wires in the zeolite.

In accordance with another illustrative embodiment, the quantum dots or the quantum wires may be, but may not be limited thereto, uniformly dispersed in pores of the zeolite.

In accordance with another illustrative embodiment, the quantum dots or the quantum wires may include, but may not be limited thereto, a metal, an oxide, or a compound semiconductor.

In an illustrative embodiment, the compound semiconductor may include, but may not be limited thereto, a sulfide and an oxide containing one or more metals, or a compound containing one or more metals and one or more non-metals. By way of example, the compound semiconductor may be selected from, but may not be limited to, the group consisting of CdS, CdO, CdSe, CdTe, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTE, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, Alp, AlAs, AlSb, GaN, GaP, GaAs, GaSb, InN, InP, InAs, InSb, BP, Si, Ge, and combinations thereof.

In accordance with still another illustrative embodiment, the basic gas may include, but may not be limited thereto, $NH_3$, $PH_3$, $AsH_3$, amine gases, or combinations thereof.

In accordance with still another illustrative embodiment, the quantum dots or the quantum wires in the pores of the zeolite may be dispersed in isolated state from each other, but the present disclosure may not be limited thereto.

In accordance with still another illustrative embodiment, the quantum dots or the quantum wires may be stably dispersed in the zeolite under an atmosphere, but the present disclosure may not be limited thereto.

In accordance with an illustrative embodiment, the zeolite may include, but may not be limited to, zeolite Y, zeolite X, zeolite A, zeolite L, mordenite, gallosilicate, borosilicate, silicoaluminophosphate (SAPO), or aluminophosphate (ALPO).

Hereinafter, illustrative embodiments of the present disclosure will be explained in detail with reference to the accompanying drawings. However, the present disclosure may not be limited to the drawings and the illustrative embodiments.

FIG. 1 schematically shows a structure of zeolite Y and a structure of zeolite Y containing quantum dots in accordance with an illustrative embodiment of the present disclosure.

Within the zeolite Y, there are two types of cages: a sodalite cage; and a supercage. In accordance with an illustrative embodiment of the present disclosure, if zeolite in which quantum dots are metal-ion-exchanged in an anhydrous state is produced by a process using chalcogenide hydrogen, the quantum dots are present within a supercage (FIG. 1-C). In accordance with another illustrative embodiment of the present disclosure, instead of the quantum dots, quantum wires may be present in the zeolite Y as described above.

By way of example, if quantum dots or quantum wires containing a material such as CdS are included in the zeolite Y, the zeolite Y whose metal ion such as $Cd^{2+}$ is exchanged is dehydrated by ventilation at a high temperature (about 300° C.) and then $H_2S$ is continuously exposed to the dried zeolite Y whose metal ion such as $Cd^{2+}$ is exchanged (Formula 1 below). According to this method, for example, the quantum dots such as CdS quantum dots or the quantum wires and a $H^+$ ion are formed within a supercage of the zeolite Y:

$$Cd^{2+}(ZO^-)_2 + H_2S \rightarrow [2H^+, CdS]_{sup}(ZO^-)_2 \quad \text{[Formula 1]}$$

wherein in Formula 1, $(ZO^-)$ represents a zeolite structure charged with anions and $[\ ]_{sup}$ represents a supercage within the zeolite.

Meanwhile, if a dry ammonia gas is added to the zeolite Y prepared by the above-described method and including the quantum dots or the quantum wires containing a material such as CdS, the $H^+$ ion is easily neutralized and the quantum dots or the quantum wires are arranged in a $NH_4^+$ environment (Formula 2 below):

$$[2H^+, CdS]_{sup}(ZO^-)_2 + 2NH_3 \rightarrow [2NH_4^+, CdS]_{sup}(ZO^-)_2 \quad \text{[Formula 2]}$$

wherein in Formula 2, $(ZO^-)$ represents a zeolite structure charged with anions and $[\ ]_{sup}$ represents a supercage within the zeolite.

The quantum dots or the quantum wires in the zeolite Y are classified into "isolated quantum dots or isolated quantum wires" present in the supercage (FIG. 1-C), "interconnected quantum dots or interconnected quantum wires" formed such that isolated quantum dots are connected to each other through a window of the supercage (FIG. 1-D), and "meso-sized quantum dots or meso-sized quantum wires" present in a meso-sized space, on an outer surface thereof, and on an outer surface of a non-crystalline aluminosilicate material formed by cracks of a structure (FIG. 1-E). In an illustrative embodiment of the present disclosure, in the case of CdS quantum dots or CdS quantum wires, isolated quantum dots or quantum wires, interconnected quantum dots or quantum wires, and meso-sized quantum dots or quantum wires have maximum absorption wavelengths ($\lambda_{max}$) of from about 200 nm to about 300 nm, from about 300 nm to about 380 nm and from about 380 nm to about 480 nm, respectively. The maximum absorption wavelengths are used to confirm characteristics of the quantum dots or the quantum wires.

Meanwhile, as water is absorbed, the zeolite structure is destroyed and the isolated quantum dots or quantum wires agglomerate with the interconnected quantum dots or quantum wires and the meso-sized quantum dots or quantum wires in a $H^+$ environment, whereas the isolated quantum dots or quantum wires and the zeolite structure are preserved and the interconnected quantum dots or quantum wires are decomposed into isolated quantum dots or quantum wires in a $NH_4^+$ environment, which is summarized in Table 1 below.

TABLE 1

| Cation | | Dry state | Water-containing state |
|---|---|---|---|
| $H^+$ | Quantum dots or quantum wires | Isolated quantum dots or quantum wires | Interconnected quantum dots or quantum wires and meso-sized quantum dots or quantum wires |
| $NH_4^+$ | Zeolite structure | Preserved | Destroyed |
| | Quantum dots or quantum wires | Isolated quantum dots or quantum wires and interconnected quantum dots or quantum wires | Isolated quantum dots or quantum wires |
| | Zeolite structure | Preserved | Preserved |

Within the zeolite in an acid environment, very small isolated quantum dots or quantum wires destroy the structure and also agglomerate so as to be larger isolated quantum dots or quantum wires. Within the zeolite in a neutralized or basic environment, isolated quantum dots or quantum wires are maintained as being isolated and interconnected quantum dots or quantum wires formed unexpectedly are decomposed into isolated quantum dots or quantum wires.

Figure 7:
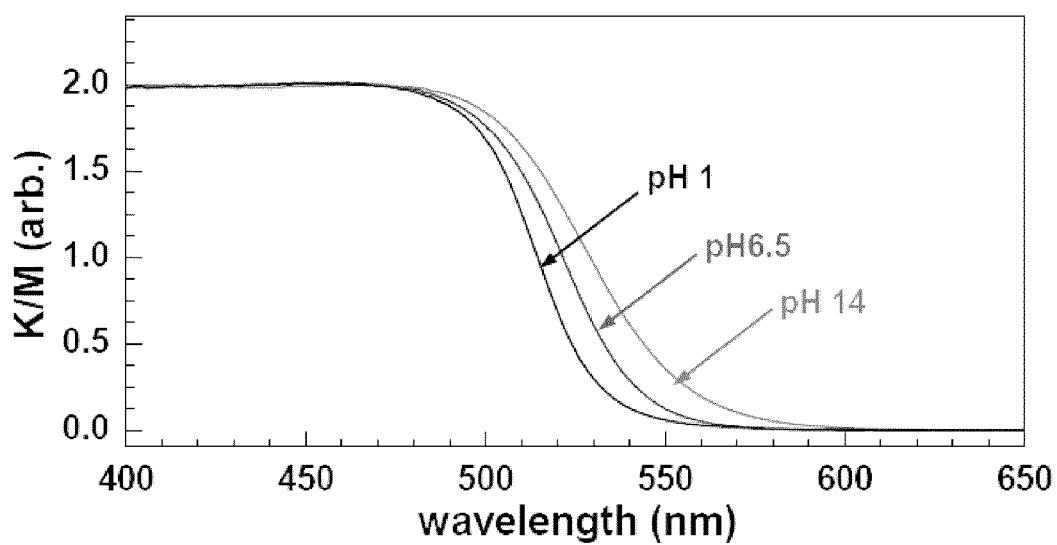
FIG. 7 provides diffuse reflectance spectra of CdS powders prepared in different pH conditions in accordance with an example of the present disclosure.

Meanwhile, it can be seen that quantum dots or quantum wires within an aqueous solution become larger while quantum dot particles or quantum wire particles are formed along with an increase in pH (see FIG. 7). Thus, the characteristics of the quantum dots or quantum wires in the zeolite are exactly contrary to their characteristics within the aqueous solution.

Figure 8:
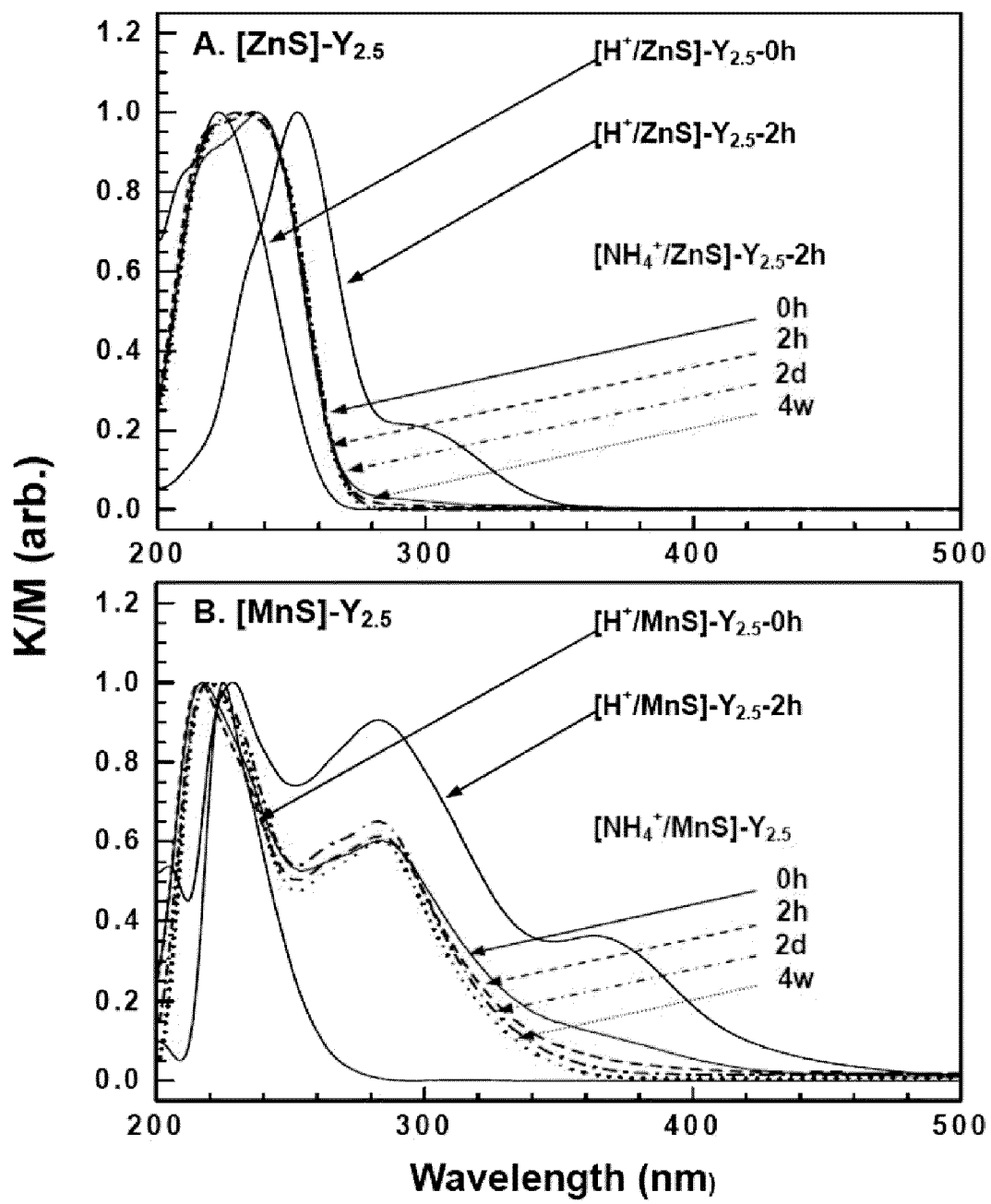
FIG. 8 provides diffuse reflectance UV-vis spectra of [ZnS]—Y$_{2.5}$ and [MnS]—Y$_{2.5}$ exposed to an atmosphere for various time periods in accordance with an example of the present disclosure.

The contrary characteristics of CdS within the zeolite Y and within the aqueous solution show that within hydrated zeolite Y in a $NH_4^+$ environment, small-sized quantum dots or quantum wires are more stable than large-sized quantum dots or quantum wires, which means that the $NH_4^+$ environment is a driving force for decomposing interconnected quantum dots or quantum wires and dispersing small-sized quantum dots or quantum wires in pores. This can be observed from ZnS and MnS quantum dots or quantum wires in zeolite Y in a similar manner (FIG. 8). In the case of MnS quantum dots or MnS quantum wires, meso-sized quantum dots or quantum wires are absorbed by zeolite Y having $NH_4^+$ as a counter cation.

If the counter cation is $H^+$, in order to protect isolated quantum dots or quantum wires and interconnected quantum dots or quantum wires within zeolite under an atmosphere, it is necessary to coat an outer surface of the zeolite Y with a hydrophobic octadecyl group. However, when the surface is coated, pore mouths are blocked, and, thus, the isolated quantum dots or quantum wires and the interconnected quantum dots or quantum wires can be used only for an optical purpose. Meanwhile, within $NH_4^+$-zeolite Y, isolated and exposed quantum dots or quantum wires with a size of less than nanometers are not influenced by water introduced into pores, and, thus, they can be used as other application materials such as a catalyst at an appropriately high temperature (for example, 100° C.) where a $NH_4^+$ ion is stable.

Hereinafter, the present disclosure will be explained in detail with reference to examples. However, the present disclosure may not be limited thereto.

MODE FOR CARRYING OUT THE INVENTION

Zeolite Y powder used in the present example had an average diameter of 0.1 μm and was composed of nano zeolite Y (expressed by $[(TMA^+)_{sod}]$-$Y_{1.8}$) having a $TMA^+$ ion with a ratio of Si/Al=1.8 and zeolite Y (expressed by $Y_{1.8}$) induced by removing a $TMA^+$ ion from the $[(TMA^+)_{sod}]$-$Y_{1.8}$ by means of calcination within sodalite cages, respectively. Further, for appropriate comparison, commercially available zeolite Y (expressed by $Y_{2.5}$) having an average particle diameter of 1.0 mm with a ratio of Si/Al=2.5 was also used. The $[(TMA^+)_{sod}]$-$Y_{1.8}$ and the $Y_{1.8}$ were present as particles and the $Y_{2.5}$ was present as being agglomerated.

Experiment Materials $TMA^+$-containing zeolite Y (a ratio of Si/Al=1.8) was synthesized by using tetraethyl orthosilicate (TEOS, Acros), aluminum isopropoxide $[Al(iPrO)_3$, Aldrich], tetraammonium hydroxide (TMAOH, 25% aqueous solution, Aldrich), sodium silicate ($Na_2SiO_3$, $Na_2O$ of from 17% to 19% and $SiO_2$ of from 35% to 38%, Kanto), sodium aluminate ($NaAlO_2$, $Na_2O$ of from 31% to 35% and $Al_2O_3$ of from 34% to 39%, Kanto), and sodium hydroxide (NaOH, Samchun) as indicated. Commercially available zeolite Y (Lot No. 1997060001) having an average particle diameter of 1.5 μm or less with a ratio of Si/Al=2.5 was purchased from UOP (in January 2002). $Cd(NO_3)_2.4H_2O$ (Junsei), $Zn(NO_3)_2.6H_2O$ (Junsei), and $MnCl_2.4H_2O$ (J. T. Baker) were used as indicated. Dry $H_2S$ and $NH_3$ gases were purchased from Regas. $BaSO_4$ was purchased from Aldrich.

Experiment Equipments

Diffuse reflectance UV-vis spectra of a sample were measured by a Shimadzu UV-3101PC. CP-MAS$^{13}$C-NMR of $TMA^+$-containing zeolite was measured by a solid-state FT-NMR spectrometer (DSX 400 MHz) manufactured by BrukerAnalytische GmbH and installed at Korea Basic Science Institute in Kyungpook National University. Chemical shift was measured by fixing a left side of adamantine having a stronger peak at 38.30 ppm with respect to $^{13}$C NMR. A SEM (Scanning Electron Microscope) image of a zeolite film was obtained by using a FE-SEM (Hitachi S4300) at an acceleration voltage of 20 kV. An platinum-palladium alloy (a ratio of 8:2) was deposited on a sample surface to a thickness of about 15 nm. An EDX analysis was carried out to the sample whose surface was not coated with platinum-palladium by using a Horiba EX-220 Energy Dispersive X-ray Micro Analyzer (model: 6853-H) of a FE-SEM. A TEM (Transmission Electron Microscope) image was captured by using a JEOL JEM-4010 at an acceleration voltage of 400 kV.

PREPARATION EXAMPLE

Synthesis of Tetramethylammonium Cation($TMA^+$)-Containing Zeolite Y

By using $Al_2O_3$, $SiO_2$, TMA, $Na_2O$, and $H_2O$ with a ratio of 1:3.6:6.2:0.05:250, gel composed of $Al(iPrO)_3$, TEOS, TMAOH, NaOH, and $H_2O$ was prepared. The gel was prepared as follows. A TMAOH solution (25%, 112.8 g) was diluted in 315 g of distilled deionized water (DDW). 20.8 g of $Al(iPrO)_3$ was added to the solution, and the mixture was stirred for 1 hour, so that the $Al(iPrO)_3$ was hydrolyzed. TEOS (38.3 g) was added to the mixture and stirred for 2 hours. A diluted NaOH solution composed of 0.2 g of NaOH and 50 g of DDW was added to the transparent solution. With continuous stirring, the mixture was aged at room temperature for 12 hours. Then, the synthesized gel was transferred to a polypropylene bottle and heated at a temperature of 100° C. in a static condition for 7 days. ($TMA^+$)-containing zeolite Y crystals (average size of 80 nm) produced were collected through centrifugation at 9,000 rpm and washed with a great amount of DDW. Thereafter, the crystals were dried at room temperature in a vacuum. Since the $TMA^+$ ions were contained in a supercage and a sodalite cage, the synthesized ($TMA^+$)-containing zeolite Y was expressed by $[Na^+/(TMA^+)_{sup}/(TMA^+)_{sod}]$-Y. A ratio of Si/Al in the zeolite was measured as 1.8. Therefore, according to the definition of calling FAU zeolite as zeolite Y in the case of Si/Al with a ratio of more than 1.5 (Zeolite Molecular Sieves, D. T. Breck, Wiley, New York, 1974, p. 93), the above zeolite was called zeolite Y (or expressed by Y as necessary).

EXAMPLE 1

Preparation of ($H^+$/QD)-Containing Zeolite Y {[$H^+$/QD]-Y, (QD=CdS, ZnS, and MnS)}

Above all, zeolite-Y (6.0 g) of UOP was put into a flask containing 100 mL of a 1.7 M NaCl solution. Then, the slurry was shaken and mixed for 24 hours, and the zeolite-Y treated with NaCl was collected through centrifugation. The collected zeolite ($[Na^+]$—Y) was repeatedly washed until chloride ions were removed from a surface of the solution.

In order to ion-exchange $Na^+$ for $Cd^{2+}$, 3.0 g of the washed $[Na^+]$—Y powder was dispersed in a 100 mL of DDW. $Cd(NO_3)_2.4H_2O$ (1.85 g) was dissolved in a 100 mL of DDW separately. The $Cd(NO_3)_2.4H_2O$ aqueous solution was slowly added to the colloidal zeolite solution with stirring. The solutions were shaken and mixed for 10 hours, and the $Cd^{2+}$-exchanged zeolite powder was separated through centrifugation. The zeolite paste separated by repeating a cycle of dispersion-centrifugation-solution surface decantation 10 times was washed with new DDW (45 mL). The washed $Cd^{2+}$-exchanged zeolite ($[Cd^{2+}]$—Y) powder was transferred to a glass tube connected to a non-greased stopper and dried at 350° C. for 5 hours in a vacuum ($10^{-5}$ Torr). A dry $H_2S$ gas (760 Torr) was put into the glass tube containing the dried $[Cd^{2+}]$—Y powder, and the $Cd^{2+}$ ion in the $[Cd^{2+}]$—Y was allowed to react with the $H_2S$ gas at room temperature for 20 minutes. By removing an excessive amount of the $H_2S$ gas, dry ($H^+$/CdS)-containing zeolite-Y {[$H^+$/CdS]—Y} was collected readily. $Zn^{2+}$-exchanged zeolite-Y {[$Zn^{2+}$]—Y} and $Mn^{2+}$-exchanged zeolite-Y {[$Mn^{2+}$]—Y} were prepared from $[Na^+]$—Y by using $Zn(NO_3)_2.6H_2O$, and $MnCl_2.4H_2O$, respectively. Dry ZnS-containing zeolite-Y {[$H^+$/ZnS]—Y} and dry MnS-containing zeolite-Y {[$H^+$/MnS]—Y} were prepared in a similar manner as described above.

EXAMPLE 2

Preparation of $[H^+/CdS/(TMA^+)_{sod}]$-Containing Zeolite Y {$[H^+/CdS/(TMA^+)_{sod}]$-Y}

By exchanging $Na^+$ in $[(Na^+)(TMA^+)_{sup}(TMA^+)_{sod}]$-Y for $Cd^{2+}$ with $Cd(NO_3)_2.4H_2O$, $Cd^{2+}$-exchanged $(TMA^+)_{sod}$-Y {$[Cd^{2+}/(TMA^+)_{sod}]$-Y} was prepared. Similarly, by exchanging $Na^+$ and $(TMA^+)_{sup}$ in $[Na^+/(TMA^+)_{sup}/(TMA^+)_{sod}]$-Y for $Cd^{2+}$, {$H^+/CdS/(TMA^+)_{sod}$}-containing Y {$[H^+/CdS/(TMA^+)_{sod}]$-Y} was prepared.

EXAMPLE 3

Preparation of $[NH_4^+/CdS]$-Zeolite Y {$[NH_4^+/CdS]$—Y} and $[NH_4^+/CdS/(TMA^+)_{sod}]$-Zeolite Y {$[NH_4^+/CdS/(TMA^+)_{sod}]$-Y}

An excessive amount of a $H_2S$ gas containing the prepared [H+/CdS]—Y in a Schlenk tube was ventilated and removed. Ar was purged in the tube, and a $H_2S$ gas remaining after the ventilation was removed. This process was repeated 3 times so as to completely remove the $H_2S$ gas. Thereafter, a dry $NH_3$ gas (760 Torr) was put into the tube at room temperature and allowed to react with $H^+$ in the [$H^+$/CdS]—Y for 20 minutes. A product of the reaction was expressed by [$NH_4^+$/CdS]—Y]. An unreacted $NH_3$ gas was removed from the tube at 60° C. for 6 hours in a vacuum. Ar was purged in the tube for 1 hour and a $NH_3$ gas remaining after ventilation was removed. In similar manners to [$H^+$/ZnS]—Y, [$H^+$/MnS]—Y, and [$H^+$/CdS/(TMA$^+$)$_{sod}$]-Y, [$NH_4^+$/ZnS]—Y, [$NH_4^+$/MnS]—Y, and [$NH_4^+$/CdS/(TMA$^+$)$_{sod}$]-Y were prepared, respectively.

Compositions of the M-exchanged zeolite and MS-containing zeolite used in the present example are shown in Table 2 below.

TABLE 2

| Types of zeolite | Compositions | MS content (wt %) |
| --- | --- | --- |
| [$Na^+$/($TMA^+$)$_{sup}$/($TMA^+$)$_{sod}$]-Y | $Na_{53.3}(TMA_{5.8})_{sup}(TMA_{7.9})_{sod}Al_{67}Si_{125}O_{384}$ | |
| [$Na^+$/($TMA^+$)$_{sod}$]-Y | $Na_{59.1}(TMA_{7.9})_{sod}Al_{67}Si_{125}O_{384}$ | |
| [$Cd^{2+}$/($TMA^+$)$_{sod}$]-Y | $Cd_{29.5}Na_{0.1}(TMA_{7.9})_{sod}Al_{67}Si_{125}O_{384}$ | |
| [$H^+$/CdS/($TMA^+$)$_{sod}$]-Y | $Cd_{29.5}S_{29.2}H_{58.4}Na_{0.1}(TMA_{7.9})_{sod}Al_{67}Si_{125}O_{384}$ | 26.0 |
| [$NH_4^+$/CdS/($TMA^+$)$_{sod}$]-Y | $Cd_{29.5}S_{29.2}(NH_4)_{58.4}Na_{0.1}(TMA_{7.9})_{sod}Al_{67}Si_{125}O_{384}$ | 24.6 |
| [$Na^+$]-Y | $Na_{54.0}Al_{54}Si_{138}O_{384}$ | |
| [$H^+$]-Y | $H_{54.0}Al_{54}Si_{138}O_{384}$ | |
| [$Cd^{2+}$]-Y | $Cd_{27.0}Al_{54}Si_{138}O_{384}$ | |
| [$H^+$/CdS]-Y | $Cd_{27.0}S_{26.8}H_{53.6}Al_{54}Si_{138}O_{384}$ | 25.2 |
| [$NH_4^+$/CdS]-Y | $Cd_{27.0}S_{26.8}(NH_4)_{53.6}Al_{54}Si_{138}O_{384}$ | 23.9 |
| [$Zn^{2+}$]-Y | $Zn_{27.0}Al_{54}Si_{138}O_{384}$ | |
| [$H^+$/ZnS]-Y | $Zn_{27.0}S_{26.6}H_{53.2}Al_{54}Si_{138}O_{384}$ | 18.5 |
| [$NH_4^+$/ZnS]-Y | $Zn_{27.0}S_{26.6}(NH_4)_{53.2}Na_{0.0}Al_{54}Si_{138}O_{384}$ | 17.4 |
| [$Mn^{2+}$]-Y | $Mn_{27.0}Al_{54}Si_{138}O_{384}$ | |
| [$H^+$/MnS]-Y | $Mn_{27.0}S_{26.5}H_{53.0}Na_{0.0}Al_{54}Si_{138}O_{384}$ | 16.8 |
| [$NH_4^+$/MnS]-Y | $Mn_{27.0}S_{26.5}(NH_4)_{53.0}Na_{0.0}Al_{54}Si_{138}O_{384}$ | 15.8 |

EXAMPLE 4

Measurement of Diffuse Reflectance UV-Vis Spectrum

Dry and pure CdS-encapsulated zeolites $Y_{2.5}$ containing $H^+$ as a counter cation were exposed to wet atmosphere for 0 hour and 2 hours (expressed by [$H^+$/CdS]—$Y_{2.5}$-0 h and [$H^+$/CdS]—$Y_{2.5}$-2 h), respectively. A diffuse reflectance UV-vis spectrum of each zeolite was measured and shown in FIG. 2-A. An amount of CdS quantum dots in the $Y_{2.5}$ was from 27 CdS to 29 CdS per unit cell (see Table 2). Actually, isolated quantum dots only were present in the [$H^+$/CdS]—$Y_{2.5}$-0 h, whereas all the three types of quantum dots, i.e. isolated quantum dots, interconnected quantum dots, and meso-sized quantum dots, were present together in the [$H^+$/CdS]—$Y_{2.5}$-2 h.

Figure 2:
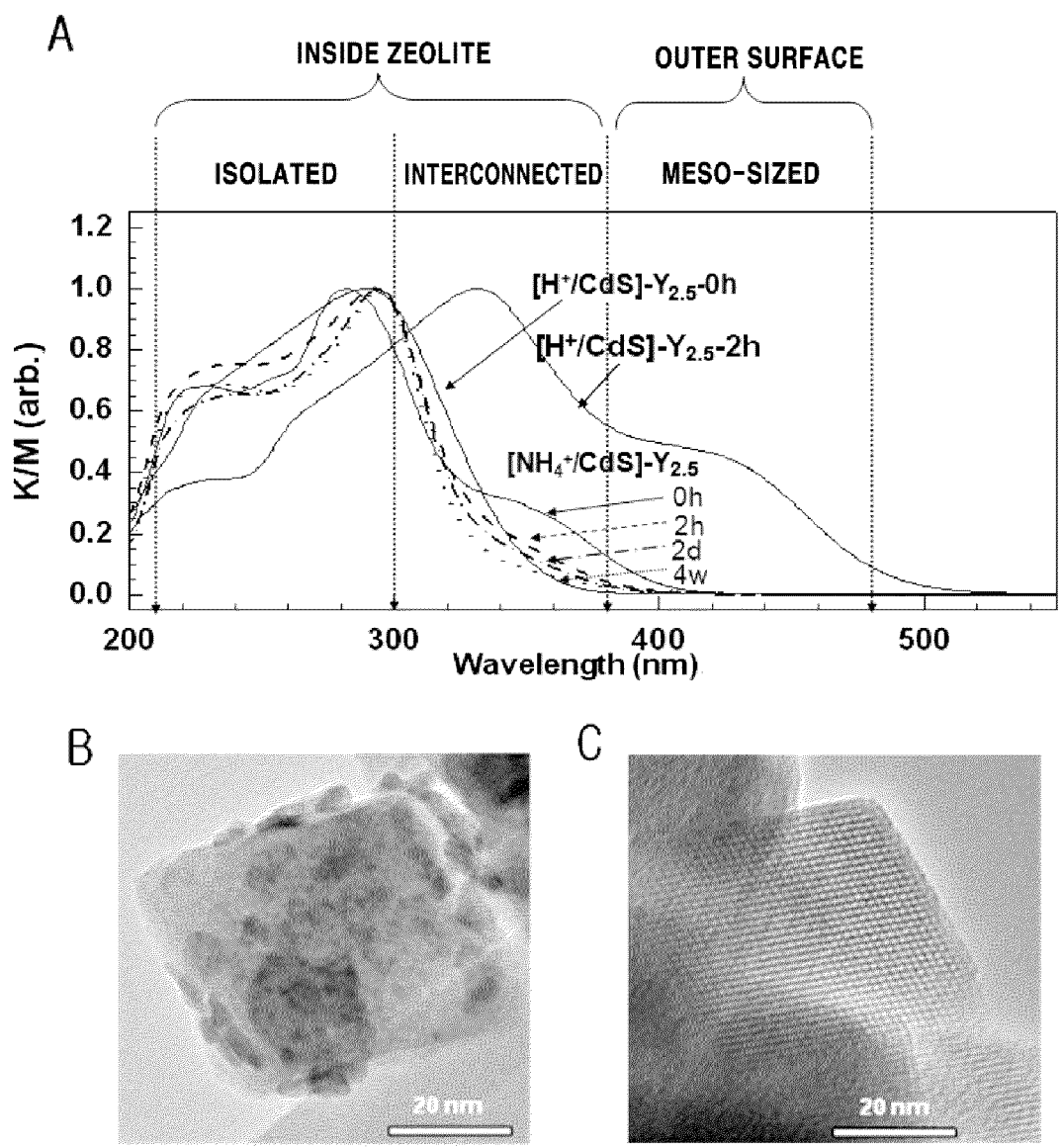
FIG. 2 provides diffuse reflectance spectra of zeolite Y containing various kinds of dry CdS and spectra of isolated CdS quantum dots, interconnected CdS quantum dots, and meso-sized CdS quantum dots before and after exposure to an atmosphere for different time periods (A); a TEM image of $[H^+/CdS]-Y_{2.5}$-1 d (B); and a TEM image of $[NH_4^+/CdS]-Y_{2.5}$-4 w (C) in accordance with an example of the present disclosure.

FIG. 2 provides diffuse reflectance spectra of zeolite Y containing various kinds of dry CdS and spectra of isolated CdS quantum dots, interconnected CdS quantum dots, and meso-sized CdS quantum dots before and after exposure to an atmosphere for different time periods (A); a TEM image of [$H^+$/CdS]—$Y_{2.5}$-1 d (B); and a TEM image of [$NH_4^+$/CdS]—$Y_{2.5}$-4 w (C) in accordance with an example of the present disclosure.

FIG. 7 provides diffuse reflectance spectra of CdS powders prepared in different pH conditions in accordance with an example of the present disclosure.

FIG. 8 provides diffuse reflectance UV-vis spectra of [ZnS]—$Y_{2.5}$ and [MnS]—$Y_{2.5}$ exposed to an atmosphere for various time periods in accordance with an example of the present disclosure.

Figure 10:
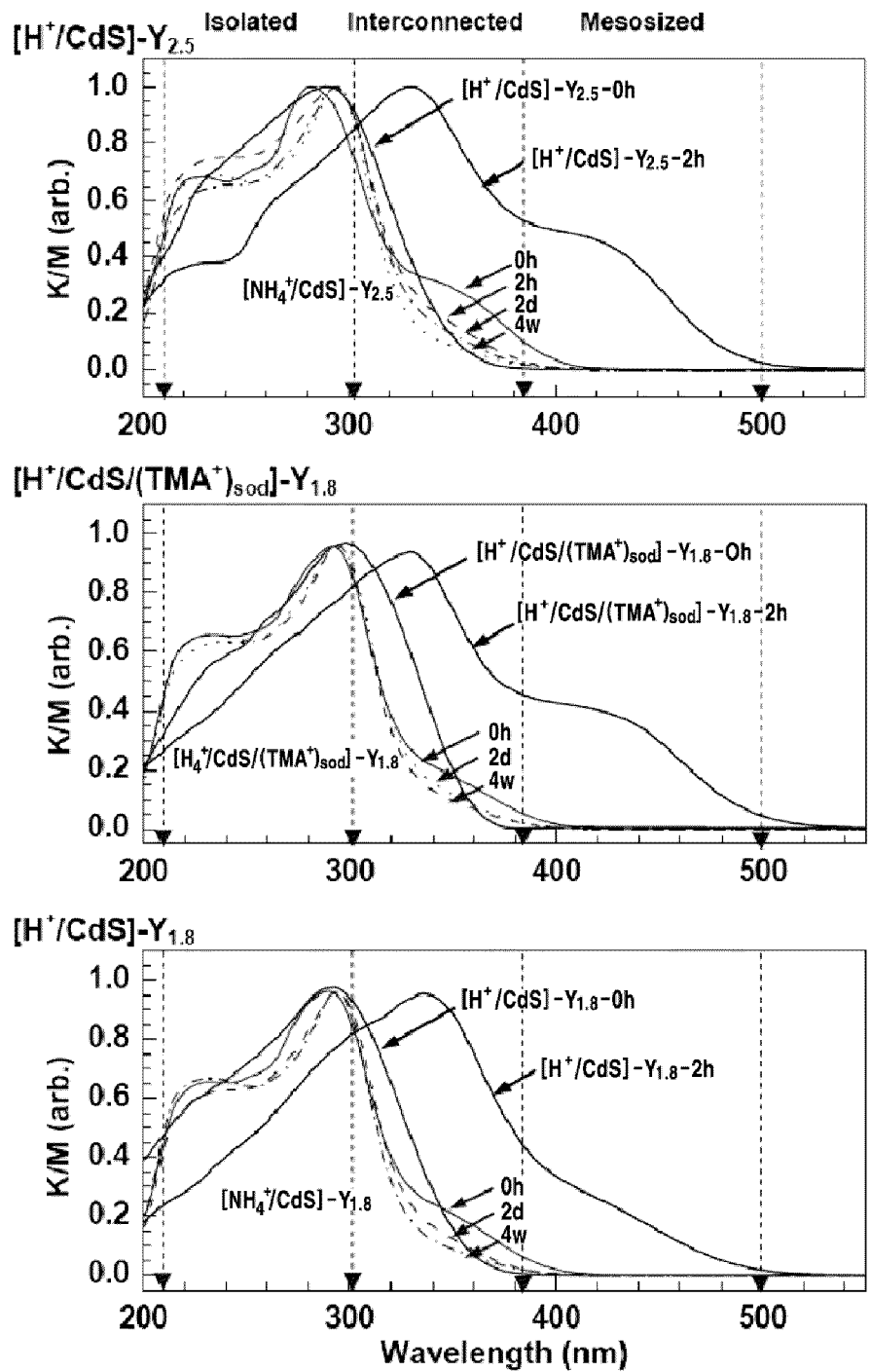
FIG. 10 provides diffuse reflectance spectra of zeolite Y containing various kinds of dry CdS and spectra of isolated CdS quantum dots, interconnected CdS quantum dots, and meso-sized CdS quantum dots before and after exposure to an atmosphere for different time periods in accordance with an example of the present disclosure.

FIG. 10 provides diffuse reflectance spectra of zeolite Y containing various kinds of dry CdS and spectra of isolated CdS quantum dots, interconnected CdS quantum dots, and meso-sized CdS quantum dots before and after exposure to an atmosphere for different time periods in accordance with an example of the present disclosure.

Dry CdS-encapsulated zeolites $Y_{2.5}$ containing $NH_4^+$ as a counter cation were exposed to the atmosphere for 0 hour, 2 hours, 2 days, and 4 weeks (expressed by [$NH_4^+$/CdS]—$Y_{2.5}$-0 h, [$NH_4^+$/CdS]—$Y_{2.5}$-2 h, [$NH_4^+$/CdS]—$Y_{2.5}$-2 d, and [$NH_4^+$/CdS]—$Y_{2.5}$-4 w), respectively. A diffuse reflectance spectrum of each zeolite was measured and shown in FIG. 2-A. While the $NH_4^+$ was absorbed into the [$H^+$/CdS]—$Y_{2.5}$, interconnected quantum dots were formed in a small amount (see a shoulder band between from 320 nm to 420 nm). However, isolated quantum dots were gradually moved to a longer wavelength range (from 291 nm to 298 nm), which means that the interconnected quantum dots were decomposed into isolated quantum dots and became extinct over time. Further, movement of an isolated quantum dot band of from 280 nm to 295 nm caused an increase in size of isolated quantum dots by means of bonds between fragments generated by decomposition of interconnected quantum dots and existing isolated quantum dots. 4 weeks later, all of interconnected quantum dot bands disappeared.

EXAMPLE 5

Capture of TEM (Transmission Electron Microscopy) Image

Dry and pure CdS-encapsulated zeolite $Y_{2.5}$ having $H^+$ as a counter cation was exposed to an atmosphere for a day (expressed by [$H^+$/CdS]—$Y_{2.5}$-1 d) and dry and pure CdS-encapsulated zeolite $Y_{2.5}$ containing $NH_4^+$ as a counter cation was exposed to an atmosphere for 4 weeks, and a TEM image of each zeolite was captured and shown in FIG. 2-B and FIG. 2-C.

It can be seen from the TEM image of the [$H^+$/CdS]—$Y_{2.5}$-1 d (FIG. 2-B) that the structure was totally destroyed and meso-sized (>3 nm) quantum dots were present on most of an outer surface thereof.

The TEM image of the [$NH_4^+$/CdS]—$Y_{2.5}$-4 w (FIG. 2-C) shows that the structure was not damaged and meso-sized CdS quantum dots were present. Therefore, it can be seen that due to the $NH_4^+$ acting as a counter cation, isolated CdS quantum dots were perfectly stable under an atmosphere and interconnected quantum dots were decomposed into isolated quantum dots.

Figure 13:
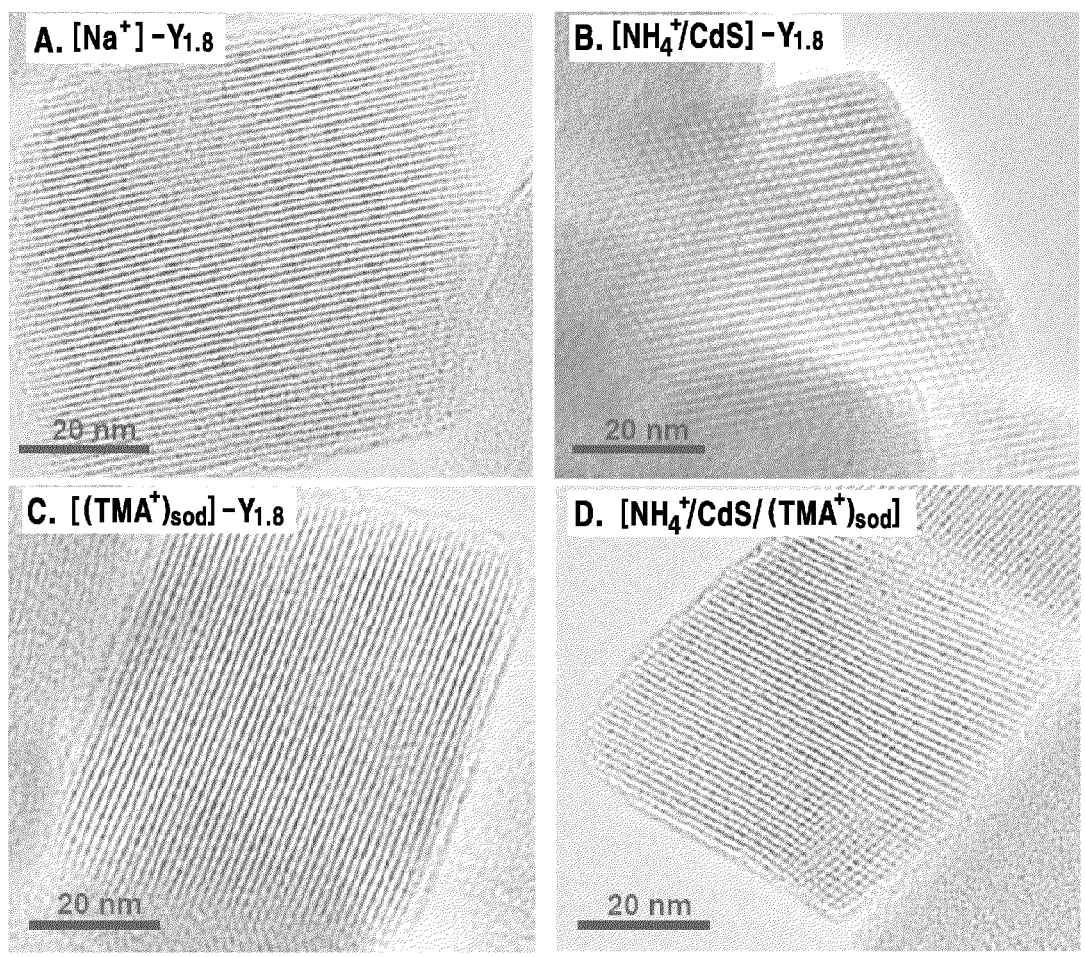
FIG. 13 provides a TEM image of [Na$^+$]—Y$_{1.8}$ (A), a TEM image of [NH$_4^+$/CdS]—Y$_{1.8}$ (B), a TEM image of [(TMA$^+$)$_{sod}$]-Y$_{1.8}$ (C), and a TEM image of [NH$_4^+$/CdS/(TMA$^+$)$_{sod}$] (D) in accordance with an example of the present disclosure.

FIG. 13 provides a TEM image of [Na$^+$]—Y$_{1.8}$ (A), a TEM image of [NH$_4^+$/CdS]—Y$_{1.8}$ (B), a TEM image of [(TMA$^+$)$_{sod}$]—Y$_{1.8}$ (C), and a TEM image of [NH$_4^+$/CdS/(TMA$^+$)$_{sod}$] (D) in accordance with an example of the present disclosure.

The results of Examples 4 and 5 show that in a NH$_4^+$ environment, very small and ligand free (isolated) CdS quantum dots were very stable in a supercage in zeolite Y despite presence of absorbed water, whereas in a H$^+$ environment, the quantum dots easily agglomerated so as to be interconnected quantum dots and meso-sized quantum dots and the structure was destroyed during the agglomeration. Based on the results, it can be seen that when the absorbed water affected characteristics of the CdS quantum dots in the zeolite Y, properties of cations or pH of zeolite water (water in pores of the zeolite) were affected.

EXAMPLE 6

X-Ray Diffraction (XRD) Pattern Measurement of Dry and Water-Containing Zeolite Samples Dry and ventilated [H$^+$]—Y,[Na$^+$]—Y, [H$^+$/CdS]—Y, [NH$_4^+$/CdS]—Y, and BaSO$_4$ powders were transferred to a dry container filled with dry Ar. The BaSO$_4$ powder was used as an internal standard. To do so, 1.6 g of each zeolite sample was mixed with 0.4 g of BaSO$_4$ in the dry container. A distributed zeolite-BaSO$_4$ mixture (0.5 g) was treated with ODC so as to prevent absorption of water and maintain the sample as being dry during measurement of XRD (see Jeong, N. C. et al., *Langmuir* 2005, 21, 6038-6047). An uncoated zeolite-BaSO$_4$ mixture sample was taken out of the dry container and exposed to the wet atmosphere for 24 hours. An XRD analysis of the sample was carried out both in a dry (ODC-treated) condition and in a wet (ODC-non-treated) condition.

Figure 3:
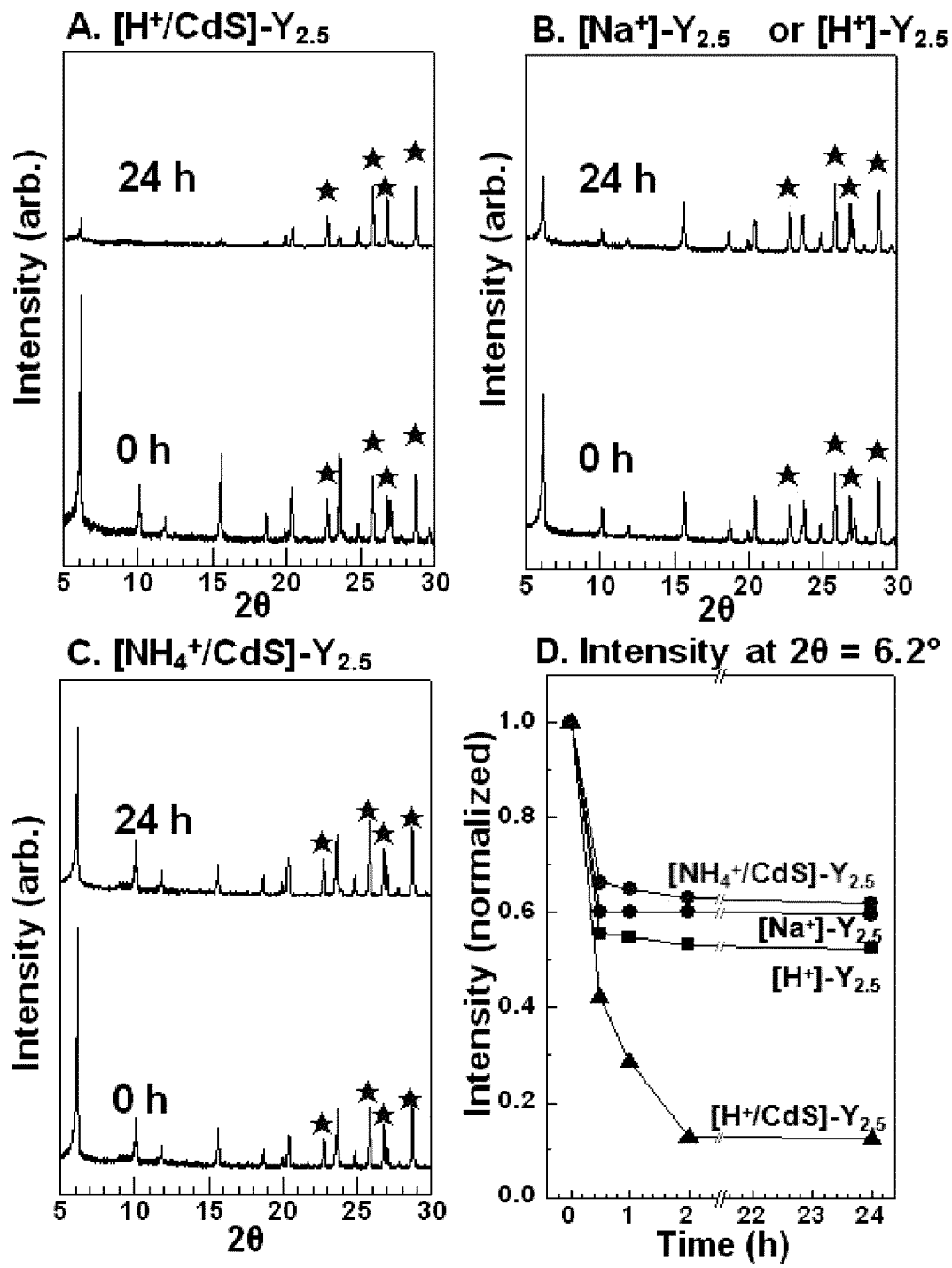
FIG. 3 provides dry X-ray powder diffraction (XRD) spectra of $[H^+/CdS]-Y_{2.5}$ (A), $[Na^+]-Y_{2.5}$ or $[H^+]-Y_{2.5}$ (B), and $[NH_4^+/CdS]-Y_{2.5}$ (C) before and after exposure to an atmosphere for 24 hours, and a plot graph of zeolite $Y_{2.5}$ with an intensity of 2θ=6.2° at each exposure time point (D) in accordance with an example of the present disclosure.
Figure 4:
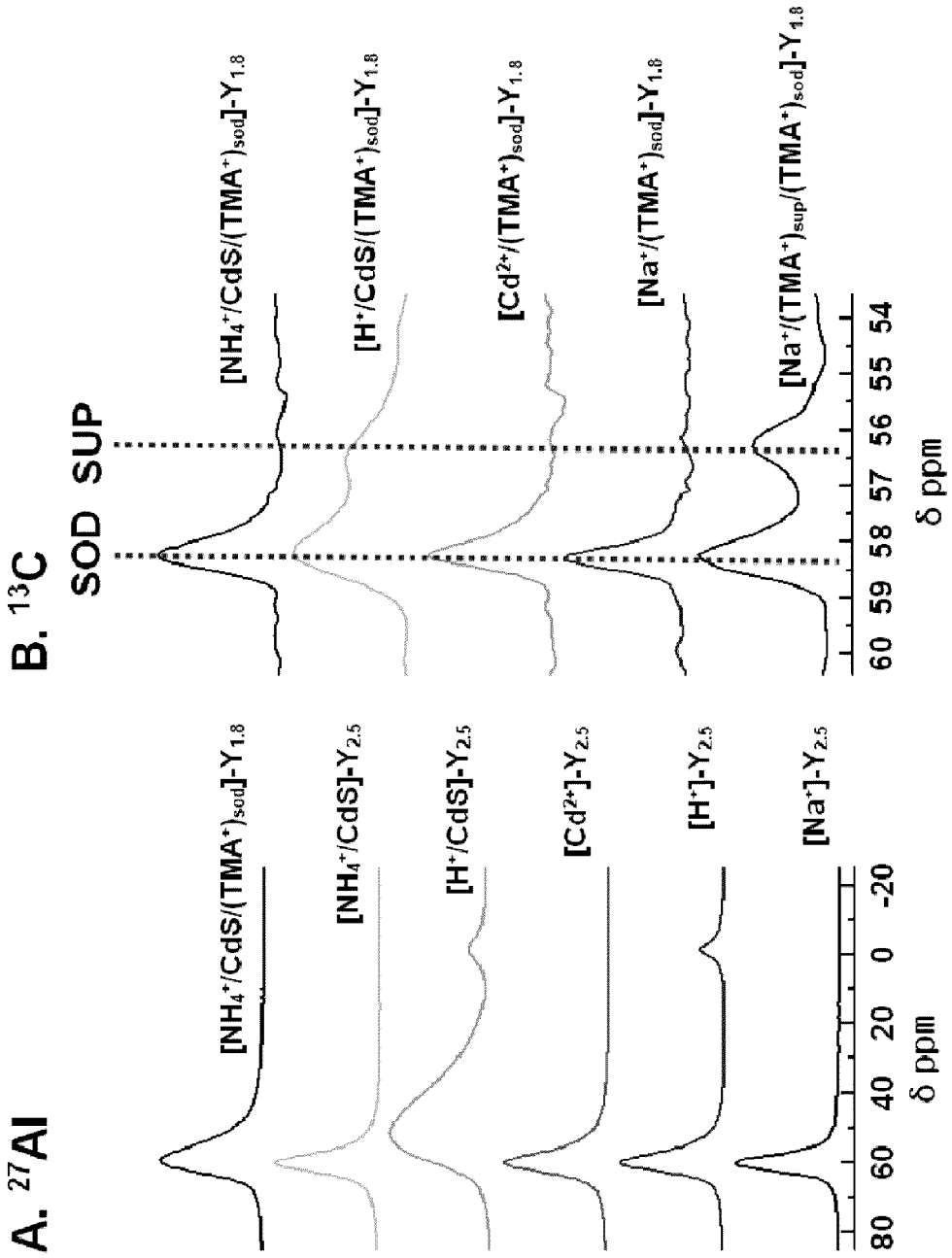
FIG. 4 provides magic angle spinning (MAS) solid-state NMR spectra of $^{27}$Al (A) and $^{13}$C (B) in various zeolite Y samples in accordance with an example of the present disclosure.

FIG. 3 provides dry X-ray powder diffraction (XRD) spectra of [H$^+$/CdS]—Y$_{2.5}$ (A), [Na$^+$]—Y$_{2.5}$ or [H$^+$]—Y$_{2.5}$ (B), and [NH$_4^+$/CdS]—Y$_{2.5}$ (C) before and after exposure to an atmosphere for 24 hours, and a plot graph of zeolite Y$_{2.5}$ with an intensity of 2θ=6.2° at each exposure time point (D) in accordance with an example of the present disclosure. FIG. 4 provides magic angle spinning (MAS) solid-state NMR spectra of $^{27}$Al (A) and $^{13}$C (B) in various zeolite Y samples in accordance with an example of the present disclosure.

Figure 11:
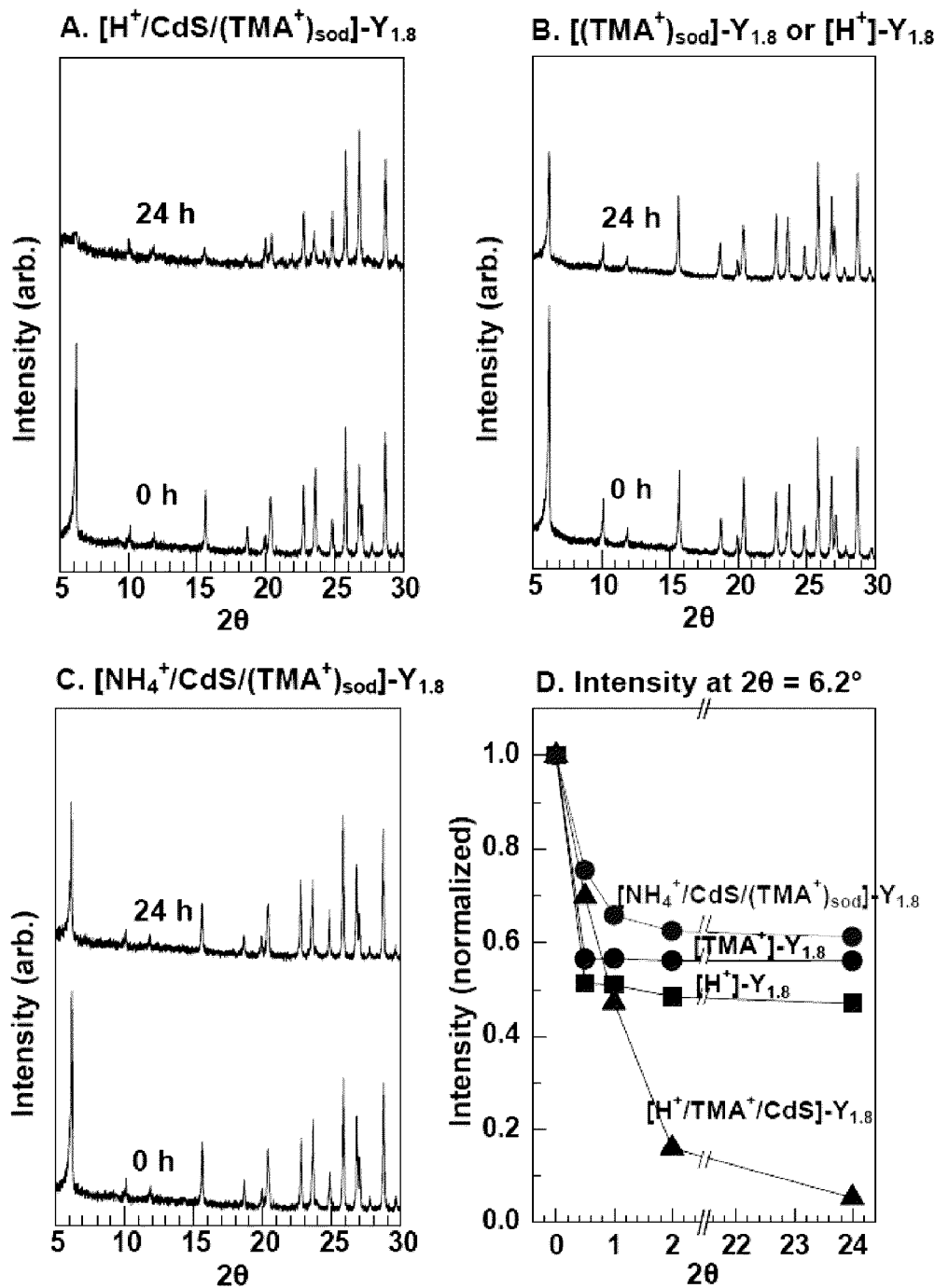
FIG. 11 provides dry X-ray powder diffraction (XRD) spectra of [H$^+$/CdS/(TMA$^+$)$_{sod}$]-Y$_{1.8}$ (A), [(TMA$^+$)$_{sod}$]-Y$_{1.8}$ or [H$^+$]—Y$_{1.8}$ (B), and [NH$_4^+$/CdS/(TMA$^+$)$_{sod}$]-Y$_{1.8}$ (C) before and after exposure to an atmosphere for 24 hours, and a plot graph of zeolite Y$_{1.8}$ with an intensity of 2θ=6.2° at each exposure time point (D) in accordance with an example of the present disclosure.

FIG. 11 provides dry X-ray powder diffraction (XRD) spectra of [H$^+$/CdS/(TMA$^+$)$_{sod}$]-Y$_{1.8}$ (A), [(TMA$^+$)$_{sod}$]-Y$_{1.8}$ or [H$^+$]—Y$_{1.8}$ (B), and [NH$_4^+$/CdS/(TMA$^+$)$_{sod}$]-Y$_{1.8}$ (C) before and after exposure to an atmosphere for 24 hours, and a plot graph of zeolite Y$_{1.8}$ with an intensity of 2θ=6.2° at each exposure time point (D) in accordance with an example of the present disclosure.

Figure 12:
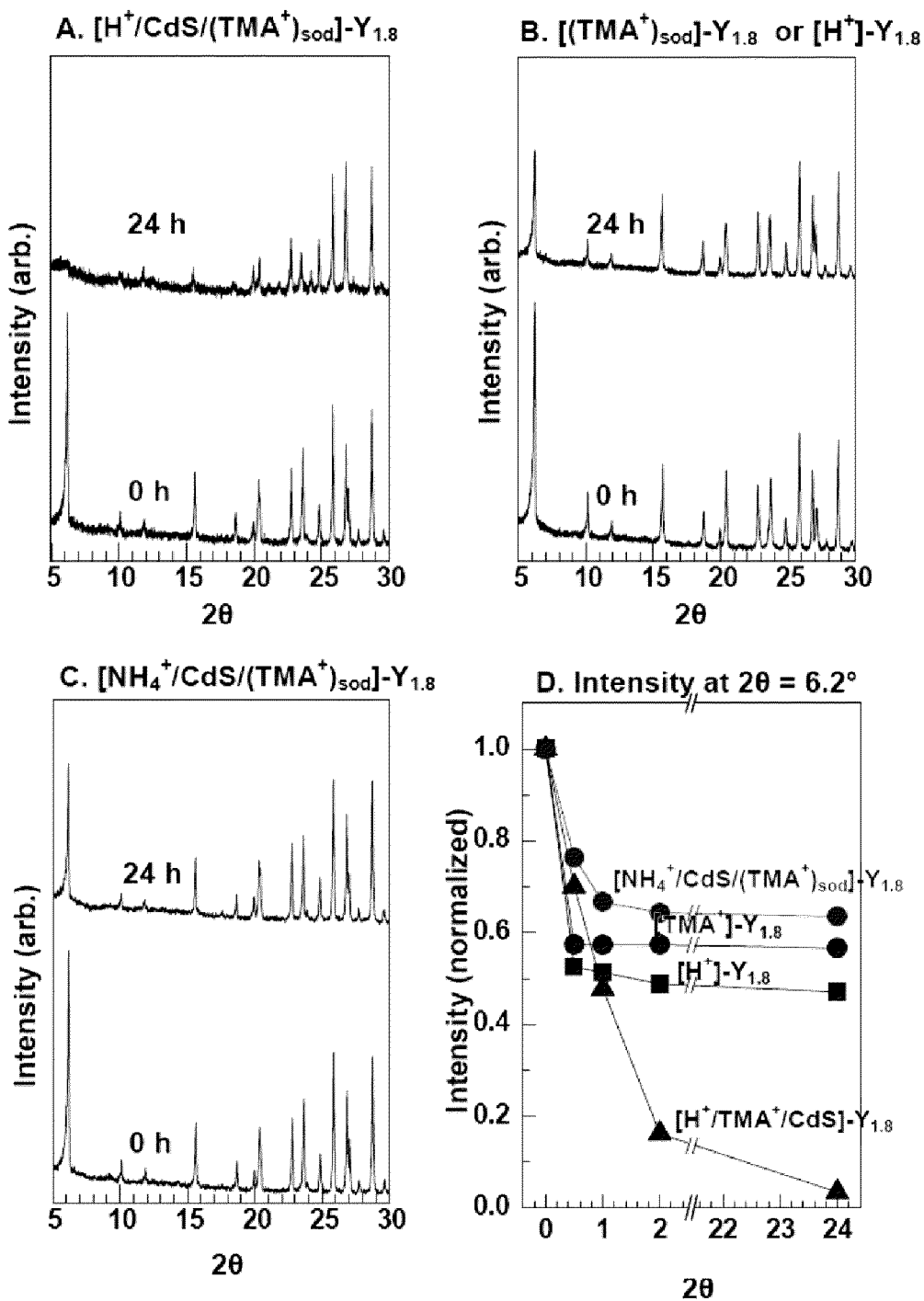
FIG. 12 provides dry X-ray powder diffraction (XRD) spectra of [H$^+$/CdS]—Y$_{1.8}$ (A), [Na$^+$]—Y$_{1.8}$ or [H$^+$]—Y$_{1.8}$ (B), and [NH$_4^+$/CdS]—Y$_{1.8}$ (C) before and after exposure to an atmosphere for 24 hours, and a plot graph of zeolite Y$_{1.8}$ with an intensity of 2θ=6.2° at each exposure time point (D) in accordance with an example of the present disclosure.

FIG. 12 provides dry X-ray powder diffraction (XRD) spectra of [H$^+$/CdS]—Y$_{1.8}$ (A), [Na$^+$]—Y$_{1.8}$ or [H$^+$]—Y$_{1.8}$ (B), and [NH$_4^+$/CdS]—Y$_{1.8}$ (C) before and after exposure to an atmosphere for 24 hours, and a plot graph of zeolite Y$_{1.8}$ with an intensity of 2θ=6.2° at each exposure time point (D) in accordance with an example of the present disclosure.

XRD patterns of [H$^+$/CdS]—Y$_{2.5}$, [Na$^+$]—Y$_{2.5}$, [H$^+$]—Y$_{2.5}$, and [NH$_4^+$/CdS]—Y$_{2.5}$ after exposure to an atmosphere in a dry condition for various time periods were exposed to an atmosphere for 24 hours. As a result, intensities of 2θ=6.2° of the [H$^+$]—Y$_{2.5}$, the [Na$^+$]—Y$_{2.5}$, and the [NH$_4^+$/CdS]—Y$_{2.5}$ were decreased by 45%, 40%, and 38%, respectively, and an intensity of 2θ=6.2° of the [H$^+$/CdS]—Y$_{2.5}$ was decreased by 90% or more (FIGS. 3-A, 3-B, and 3-C, respectively). FIG. 3-D summarizes a change in intensity over time. It can be confirmed that since the [Na$^+$]—Y$_{2.5}$ was not decomposed regardless of a hydration degree, a decreased in peak intensity of the [H$^+$]—Y$_{2.5}$, the [Na$^+$]—Y$_{2.5}$, and the [NH$_4^+$/CdS]—Y$_{2.5}$ was caused not by decomposition of a structure, but by hydration of a supercage. Therefore, it can be seen that a great decrease in peak intensity of the [H$^+$/CdS]—Y$_{2.5}$ was caused by destruction of a structure caused by hydration. In FIGS. 3-A, 3-B, and 3-C, red stars show diffraction pattern of BaSO$_3$ added according to an internal standard.

EXAMPLE 7

Magic Angle Spinning (MAS) Solid-State NMR Measurement of $^{27}$Al, $^{29}$Si, and $^{13}$C $^{27}$Al NMR (FIG. 4-A) of completely hydrated zeolite Y shows that as for [H$^+$]—Y$_{2.5}$ and [H$^+$/CdS]—Y$_{2.5}$, a small amount of eight-face-coordinated Al appeared at 0 ppm. This means that when the zeolite Y was hydrated, H$^+$ removed Al from the zeolite structure even at room temperature, and, thus, the hydrated H$^+$ caused destruction of the structure even at room temperature. Meanwhile, it is shown that as for [H$^+$/CdS]—Y$_{2.5}$, resonance of four-face coordinated Al atom occurred in a range of from 10 ppm to 70 ppm, which means that agglomeration of isolated CdS quantum dots brought about a large-scale destruction of the structure. This also means that the Al atom in the destroyed structure was four-face-coordinated or five-face-coordinated.

FIG. 4 provides magic angle spinning (MAS) solid-state NMR spectra of $^{27}$Al (A) and $^{13}$C (B) in various zeolite Y samples in accordance with an example of the present disclosure.

Figure 5:
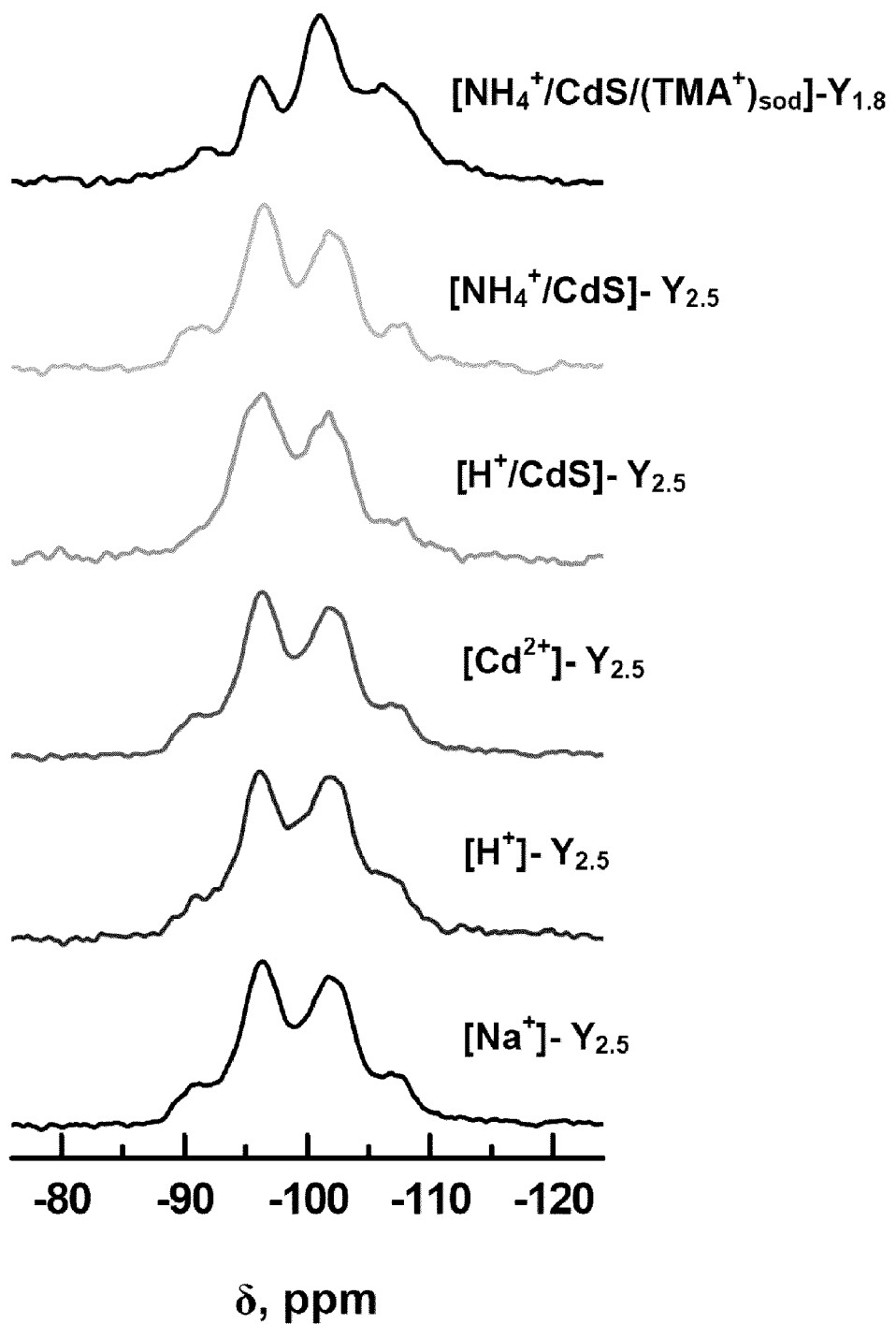
FIG. 5 provides magic angle spinning (MAS) solid-state NMR spectra of $^{29}$Si in various zeolite Y samples in accordance with an example of the present disclosure.

FIG. 5 provides magic angle spinning (MAS) solid-state NMR spectra of $^{29}$Si in various zeolite Y samples in accordance with an example of the present disclosure.

Figure 6:
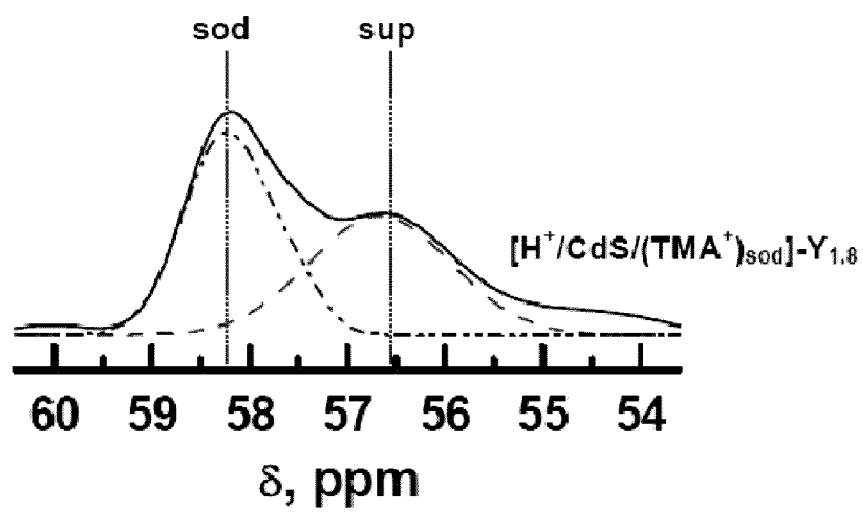
FIG. 6 provides NMR spectra of $^{13}$C in [H$^+$/CdS/(TMA$^+$)$_{sod}$]-Y$_{1.8}$ in accordance with an example of the present disclosure.

FIG. 6 provides NMR spectra of $^{13}$C in [H$^+$/CdS/(TMA$^+$)$_{sod}$]-Y$_{1.8}$ in accordance with an example of the present disclosure.

Figure 9:
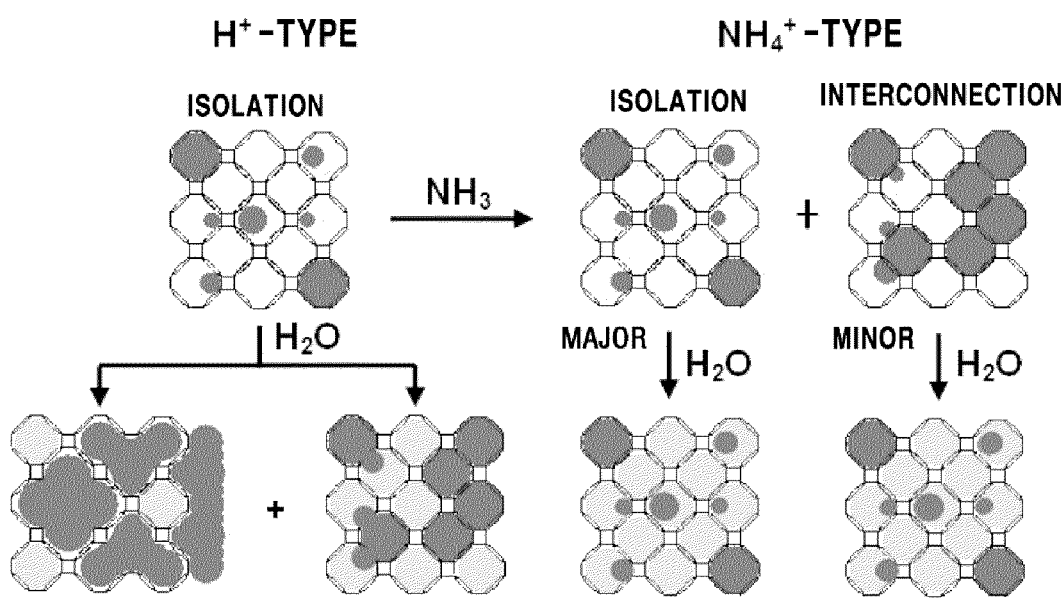
FIG. 9 schematically shows an agglomeration process and a decomposition process of quantum dots in H$^+$ and NH$_4^+$ conditions in accordance with an example of the present disclosure.

FIG. 9 schematically shows an agglomeration process and a decomposition process of quantum dots in H$^+$ and NH$_4^+$ conditions in accordance with an example of the present disclosure.

Figure 14:
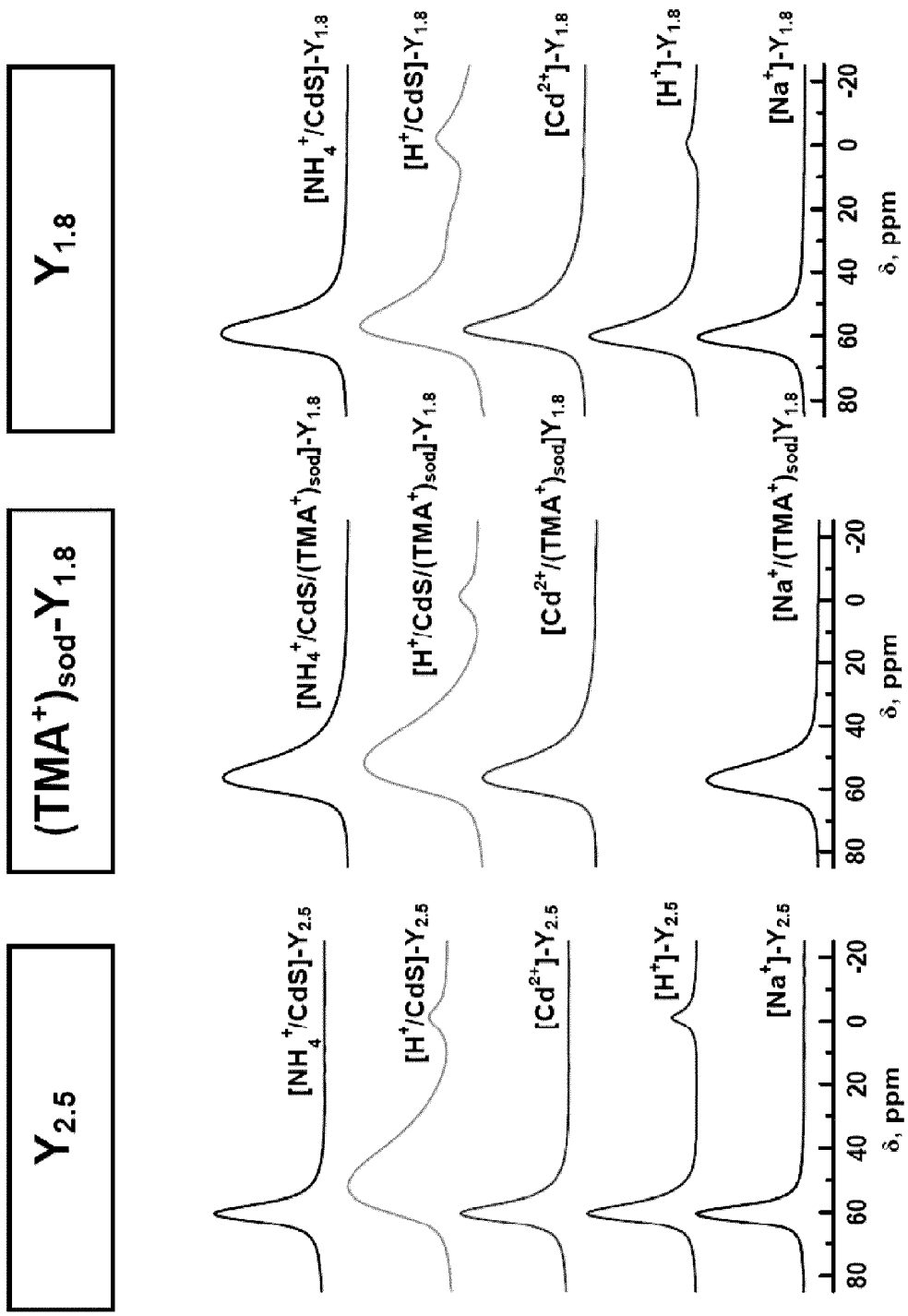
FIG. 14 provides magic angle spinning (MAS) solid-state NMR spectra of $^{27}$Al in various zeolite Y samples in accordance with an example of the present disclosure.

FIG. 14 provides magic angle spinning (MAS) solid-state NMR spectra of $^{27}$Al in various zeolite Y samples in accordance with an example of the present disclosure.

$^{29}$Si NMR spectra (FIG. 5) of completely hydrated zeolite Y samples show that as for [H$^+$/CdS]—Y$_{2.5}$, most of Q4 Si atoms (the Si atoms were connected to four Al atoms through a cross-linking reaction of 0 atom) disappeared (FIG. 5), which means that the Q4 part was susceptible to attacks. This also means that the Al atom adjacent to the Q4 Si atom was removed by an H$^+$ ion and the Al atom was eight-face-coordinated. $^{13}$C NMR spectra (FIG. 4-B) of various [TMA$^+$]$_{sod}$-Y$_{1.8}$ samples show that as for [H$^+$/CdS]$_{sup}$[TMA$^+$]$_{sod}$-Y$_{1.8}$, about 47% of TMA$^+$ ions were present in a space larger than a sodalite cage along with hydration (FIG. 6). This result shows that about 47% of sodalite cages were destroyed on a large scale, which caused a release of encapsulated TMA$^+$ ions while isolated CdS quantum dots were agglomerated due to introduction of water. Meanwhile, in a hydration state, sodalite cages in [NH$_4^+$/CdS]—Y$_{2.5}$ remained as they were even 4 weeks later.

Similar results were obtained from [H$^+$/CdS]—Y$_{1.8}$ and [H$^+$/CdS/(TMA$^+$)$_{sod}$]-Y$_{1.8}$, which means that in the presence of absorbed water in a H$^+$ and NH$_4^+$ environment, a ratio of Si/Al, a particle size, and an agglomeration state of zeolite Y did not affect properties and characteristics of generated CdS quantum dots.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

What is claimed is:

1. A dispersing method of quantum dots or quantum wires in zeolite, the method comprising:
    treating zeolite containing quantum dots or quantum wires using a basic gas,
    wherein the basic gas includes $NH_3$, $PH_3$, $AsH_3$, amine gases, or combinations thereof.

2. The dispersing method of claim 1, wherein the quantum dots or the quantum wires are uniformly dispersed in pores of the zeolite.

3. The dispersing method of claim 1, wherein the quantum dots or the quantum wires include a metal, an oxide, or a compound semiconductor.

4. The dispersion method of claim 1, wherein the quantum dots or the quantum wires are dispersed in an isolated state from each other in the pores of the zeolite.

5. The dispersing method of claim 1, wherein the quantum dots or the quantum wires are stably dispersed in the zeolite under an atmosphere.

6. The dispersing method of claim 1,
    wherein the zeolite includes zeolite Y, zeolite X, zeolite A, zeolite L, mordenite, gallosilicate, borosilicate, silicoaluminophosphate, or aluminophosphate.

7. Quantum dot- or quantum wire-containing zeolite which comprises dispersed quantum dots or dispersed quantum wires, wherein the quantum dots or the quantum wires are dispersed in the zeolite by the dispersing method of any one of claims 1-3 and 4-6.

8. The quantum dot- or quantum wire-containing zeolite of claim 7, wherein the quantum dots or the quantum wires are uniformly dispersed in pores of the zeolite.

9. The quantum dot- or quantum wire-containing zeolite of claim 7, wherein the quantum dots or the quantum wires include a metal, an oxide, or a compound semiconductor.

10. The quantum dot- or quantum wire-containing zeolite of claim 9, wherein the compound semiconductor includes a member selected from the group consisting of CdS, CdO, CdSe, CdTe, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTE, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, InN, InP, InAs, InSb, BP, Si, Ge, and combinations thereof.

11. The quantum dot- or quantum wire-containing zeolite of claim 7, wherein the quantum dots or the quantum wires are dispersed in an isolated state from each other in the pores of the zeolite.

12. The quantum dot- or quantum wire-containing zeolite of claim 7, wherein the quantum dots or the quantum wires are stably dispersed in the zeolite under an atmosphere.

13. The quantum dot- or quantum wire-containing zeolite of claim 7, wherein the zeolite includes zeolite Y, zeolite X, zeolite A, zeolite L, mordenite, gallosilicate, borosilicate, silicoaluminophosphate, or aluminophosphate.

14. A stabilizing method of quantum dots or quantum wires in zeolite, the method comprising:
    treating zeolite containing quantum dots or quantum wires with a basic gas to disperse the quantum dots or the quantum wires in the zeolite, wherein the basic gas includes $NH_3$, $PH_3$, $AsH_3$, amine gases, or combinations thereof.

15. The stabilizing method of claim 14, wherein the quantum dots or the quantum wires are uniformly dispersed in pores of the zeolite.

16. The stabilizing method of claim 14, wherein the quantum dots or the quantum wires include a metal, an oxide, or a compound semiconductor.

17. The stabilizing method of claim 14, wherein the quantum dots or the quantum wires are dispersed in an isolated state from each other in the pores of the zeolite.

18. The stabilizing method of claim 14, wherein the quantum dots or the quantum wires are stably dispersed in the zeolite under an atmosphere.

* * * * *